US012333217B2

(12) United States Patent
Loy et al.

(10) Patent No.: US 12,333,217 B2
(45) Date of Patent: Jun. 17, 2025

(54) ASSET DESIGN AND GENERATION USING DIGITAL ASSISTANT

(71) Applicant: Shutterstock, Inc., New York, NY (US)

(72) Inventors: Christopher James Loy, London (GB); Ismael Martinez Ortiz, Madrid (ES); John Farrelly, Dublin (IE); Joseph Devaney, Dublin (IE); Keenan Kadam, London (GB); Kevin Byrne, Dublin (IE); Margarita Pitsiani, London (GB); Raymond Lúí Smyth, Dublin (IE); Ruan Guimarães Barcellos, Letterkenny (IE); Timothy Alexander John Williams, Woking (GB)

(73) Assignee: Shutterstock, Inc., New York, NY (US)

( * ) Notice: Subject to any disclaimer, the term of this patent is extended or adjusted under 35 U.S.C. 154(b) by 0 days.

(21) Appl. No.: 18/645,000

(22) Filed: Apr. 24, 2024

(65) Prior Publication Data
US 2024/0354455 A1    Oct. 24, 2024

Related U.S. Application Data

(60) Provisional application No. 63/497,956, filed on Apr. 24, 2023.

(51) Int. Cl.
*G06F 17/00* (2019.01)
*G06F 30/12* (2020.01)
(Continued)

(52) U.S. Cl.
CPC ............. *G06F 30/12* (2020.01); *G06F 40/35* (2020.01); *G06F 40/40* (2020.01); *G06T 11/00* (2013.01); *G06F 3/0482* (2013.01)

(58) Field of Classification Search
CPC .......... G06F 30/12; G06F 40/35; G06F 40/40; G06F 3/0482; G06F 40/56; G06T 11/00
See application file for complete search history.

(56) References Cited

U.S. PATENT DOCUMENTS 7,840,534 B2 *  11/2010  Weber .................... G06Q 30/02
                                                      707/948
9,754,585 B2 *   9/2017  Brockett ................ G10L 15/22
(Continued)

FOREIGN PATENT DOCUMENTS

CN         117113366 A  *  11/2023
WO    WO-2021211200 A1  *  10/2021  ........... G06F 40/242
(Continued)

OTHER PUBLICATIONS

Wu, C et al., "Visual ChatGPT: Talking, Drawing, and Editing with Visual Foundation Models", Mar. 2023, URL: https://arxiv.org/pdf/2303.04671 [Retrieved on Jun. 27, 2024]; pp. 1-17. (Year: 2023).*
(Continued)

*Primary Examiner* — Laurie A Ries
(74) *Attorney, Agent, or Firm* — McDermott Will & Emery LLP

(57) ABSTRACT

As disclosed herein, a computer-implemented method for refining a description of a desired digital asset through interactive conversational exchange is provided. The computer-implemented method may include receiving, via a conversational user interface (UI), a first input from a user including a description of a desired digital asset. The computer-implemented method may include prompting the user to provide a second input including additional details about the desired digital asset. The computer-implemented method may include generating, based on the second input, a first refined description of the desired digital asset. The computer-implemented method may include providing the first refined description to a machine learning (ML) model to
(Continued)

generate the desired digital asset. A system and a non-transitory computer-readable storage medium are also disclosed.

18 Claims, 8 Drawing Sheets

(51) Int. Cl.
*G06F 40/35* (2020.01)
*G06F 40/40* (2020.01)
*G06T 11/00* (2006.01)
*G06F 3/0482* (2013.01)

(56) References Cited

U.S. PATENT DOCUMENTS

| | | | |
|---|---|---|---|
| 10,713,821 | B1 | 7/2020 | Surya et al. |
| 11,244,267 | B2* | 2/2022 | Panikkar ............ G06Q 10/0633 |
| 11,270,059 | B2 | 3/2022 | Li et al. |
| 11,587,557 | B2* | 2/2023 | Ross ................... G10L 15/1822 |
| 11,875,123 | B1* | 1/2024 | Ben David ............ G06N 3/092 |
| 2009/0193034 | A1* | 7/2009 | Hirasaki ............... G06F 16/957 |
| 2019/0318261 | A1* | 10/2019 | Deng ..................... G06N 20/00 |
| 2019/0370282 | A1* | 12/2019 | Vergnaud ............. G06V 10/764 |
| 2020/0242849 | A1* | 7/2020 | Cini ........................ G06T 19/20 |
| 2021/0319048 | A1* | 10/2021 | Aravamudan ...... G06F 16/3322 |
| 2021/0360109 | A1* | 11/2021 | Rico Ródenas .... H04M 3/5235 |
| 2022/0156663 | A1* | 5/2022 | Dua ..................... G06Q 10/105 |
| 2022/0197952 | A1* | 6/2022 | Hennig ................. H04L 51/216 |
| 2023/0037894 | A1* | 2/2023 | Arya ....................... G06F 40/40 |
| 2023/0127525 | A1* | 4/2023 | Rai ...................... G06N 3/0464 |
| | | | 706/21 |
| 2023/0205797 | A1* | 6/2023 | Das .................. G06F 16/90332 |
| | | | 704/9 |
| 2023/0214461 | A1* | 7/2023 | Brooks ................ G06Q 50/184 |
| | | | 705/27.1 |
| 2023/0214583 | A1* | 7/2023 | Sawyer ............ G06V 30/19173 |
| 2023/0409349 | A1* | 12/2023 | Morris ..................... G06F 9/453 |
| 2024/0144544 | A1* | 5/2024 | Liew ....................... G06T 11/00 |
| 2024/0194184 | A1* | 6/2024 | Haldar ..................... G06N 3/08 |

FOREIGN PATENT DOCUMENTS

| | | | | |
|---|---|---|---|---|
| WO | WO-2021231209 | A1 * | 11/2021 | ............. H04L 51/02 |
| WO | WO-2024107297 | A1 * | 5/2024 | ............. G06F 3/167 |

OTHER PUBLICATIONS

Mehdi, Y, "Create Images with your words: Bing Image Creator comes to the new Bing", official Microsoft Blog, Mar. 21, 2023 [Retrieved on Jun. 27, 2024], pp. 1-3. (Year: 2023).*

Wolinski, P., "Bing now features an AI image generator—here's how to use it", Tom's Guide, Mar. 22, 2023 [Retrieved on Jun. 27, 2024], pp. 1-14. (Year: 2023).*

US/RO—International Search Report and Written Opinion for International Appl. No. PCT/US2024/026024, mailed Aug. 21, 2024, 8 pages.

Mehdi, Y., "Create images with your words: Bing Image Creator comes to the new Bing." Official Microsoft Blog. Mar. 21, 2023 [Retrieved on Jun. 27, 2024 from https://biogs.microsoft.com/blog/2023/03/21/create-images-with-your-words-bing-image-creat or-comes-to-the-new-bing/#:~:text=By%20typing%20in%20a%20description,It's%20like%20your%20creative%20copilot.].

Wolinksi, P., "Bing now features an AI image generator-here's how to use it." Tom's Guide. Mar. 22, 2023 [Retrieved on Jun. 27, 2024 from https://www.tomsguide.com/how-to/how-to-use-bings-ai-image-generator]; entire document.

Wu, C et al., "Visual ChatGPT: Talking, Drawing and Editing with Visual Foundation Models." Mar. 2023; [Retrieved on Jun. 27, 2024 from https://arxiv.org/pdf/2303.04671]; p. 1, Abstract.

* cited by examiner

ASSET DESIGN AND GENERATION USING DIGITAL ASSISTANT

CROSS-RELATED APPLICATIONS

The present application claims the benefit of priority under 35 U.S.C. § 119(e) from U.S. Provisional Patent Application Ser. No. 63/497,956 entitled "CHAT BASED IMAGE GENERATION," filed on Apr. 24, 2023, the disclosure of which is hereby incorporated by reference in its entirety for all purposes.

BACKGROUND

Field

The present disclosure generally relates to digital asset design and generation. More particularly, the present disclosure relates to refining a description of a desired digital asset through an interactive conversational exchange.

Related Art

There has been growing interest in leveraging natural language processing (NLP) and artificial intelligence (AI) techniques to facilitate the generation of digital assets (e.g., images, video, audio, documents, interactive content, multimedia files, or the like) from textual descriptions. These approaches aim to provide users with a more intuitive and effective means of creating digital assets by allowing users to describe a desired digital asset in natural language, which is then translated into an appropriate representation (e.g., a visual or an auditory representation). When a user inputs a description of a desired digital asset, a digital asset that matches the description or that is most relevant to the description may be generated. As such, the generated digital asset is dependent on only the initial description.

SUMMARY

The subject disclosure provides for systems and methods for refining a description of a desired digital asset through an interactive conversational exchange. A user may provide an initial description of the digital asset and may be prompted to provide additional details the user may not have considered, thus clarifying the description of the digital asset and allowing the system to generate the digital asset according to the intent of the user.

According to certain aspects of the present disclosure, a computer-implemented method is provided. The computer-implemented method may include receiving, via a conversational user interface (UI), a first input from a user including a description of a desired digital asset. The computer-implemented method may include prompting the user to provide a second input including additional details about the desired digital asset. The computer-implemented method may include generating, based on the second input, a first refined description of the desired digital asset. The computer-implemented method may include providing the first refined description to a machine learning (ML) model to generate the desired digital asset.

According to another aspect of the present disclosure, a system is provided. The system may include one or more processors. The system may include a memory storing instructions that, when executed by the one or more processors, cause the system to perform operations. The operations may include receiving, via a conversational user interface (UI), a first input from a user including a description of a desired digital asset. The operations may include prompting the user to provide a second input including additional details about the desired digital asset. The operations may include generating, based on the second input, a first refined description of the desired digital asset. The operations may include providing the first refined description to a machine learning (ML) model to generate the desired digital asset.

According to yet other aspects of the present disclosure, a non-transitory computer-readable storage medium storing instructions encoded thereon that, when executed by a processor, cause the processor to perform operations is provided. The operations may include receiving, via a conversational user interface (UI), a first input from a user including a description of a desired digital asset. The operations may include prompting the user to provide a second input including additional details about the desired digital asset. The operations may include generating, based on the second input, a first refined description of the desired digital asset. The operations may include providing the first refined description to a machine learning (ML) model to generate the desired digital asset.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

Figure 1:
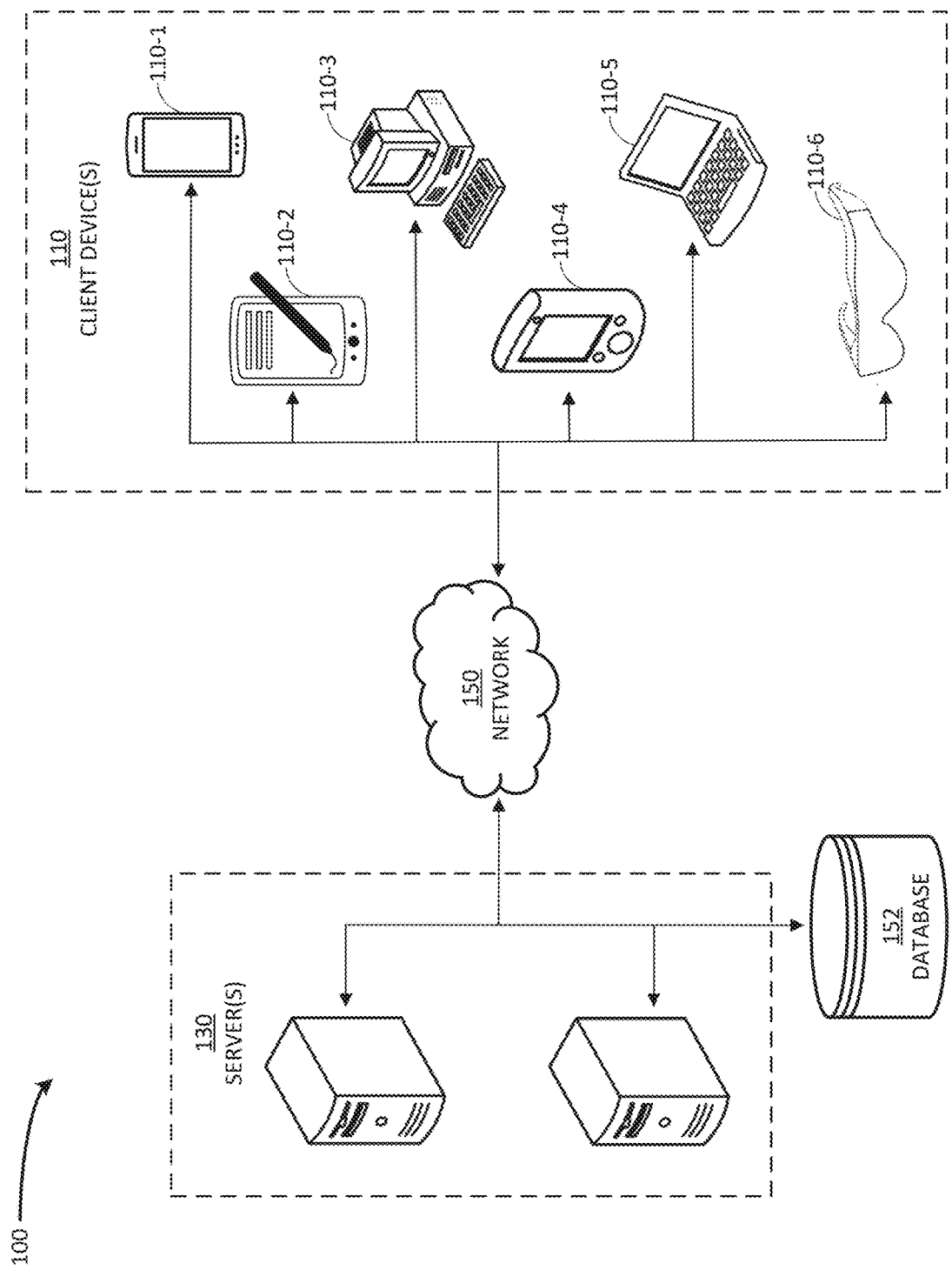
FIG. 1 illustrates an environment in which computerized systems, processes, and methods for generating a digital asset through iterative refinement of descriptions of the digital asset may operate or be used, according to some embodiments.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive. Those skilled in the art may realize other elements that, although not specifically described herein, are within the scope and the spirit of this disclosure. In addition, to avoid unnecessary repetition, one or more features shown and described in association with one embodiment may be incorporated into other embodiments unless specifically described otherwise or if the one or more features would make an embodiment non-functional.

General Overview

Traditional computer-implemented techniques for digital asset generation based on textual descriptions typically involve automated processes using predefined templates or algorithms. Although these techniques have proven effective in many cases, they often require significant time, expertise, and resources. Further, these techniques lack the flexibility in accommodating diverse input or preferences from users.

There has been growing interest in leveraging natural language processing (NLP) and artificial intelligence (AI) techniques to facilitate the generation of digital assets from textual descriptions. These approaches aim to provide users with a more intuitive and effective means of creating visual content by allowing users to describe a desired digital asset in natural language, which is then translated into an appropriate representation (e.g., a visual or an auditory representation). When a user inputs a description of a desired digital asset, a digital asset that matches the description or that is most relevant to the description may be generated. As such, the generated digital asset is dependent on only the initial description.

Generating a digital asset based on only an initial description makes it challenging to accurately generate the digital asset according to what the user has in mind. Users may be unable to clearly or perfectly identify how to describe a desired digital asset, which may result in inaccurate representations and undesirable outputs. Therefore, the creative process for users looking to generate new digital assets may be stunted.

Moreover, prior systems and techniques for digital asset generation from textual descriptions often suffer from limitations such as lack of interpretability, difficulty in capturing nuanced user preferences, and inability or inefficiency in handling iterative refinement of descriptions. These limitations can hinder the user experience and result in unsatisfactory digital asset outputs.

As disclosed herein, novel systems and methods represent a significant advancement in the field of digital asset generation by providing for generating a digital asset (e.g., image, video, audio, document, interactive content, multimedia file, or the like) through iterative refinement of descriptions (e.g., textual descriptions) of the desired digital asset using a conversational user interface (or "chatbot") designed to simulate or mimic human conversation. The conversational user interface (UI) may leverage natural language processing (NLP) and artificial intelligence (AI) techniques (e.g., machine learning (ML) techniques) to understand user inputs and generate nuanced prompts to guide the user through the refinement of their ideas and concepts.

The disclosed systems and methods may enhance user creativity by empowering a user to explore and iterate the ideas and concepts of the user, and may accelerate the creative process by offering the user useful suggestions or by asking the user thought-provoking questions.

According to an exemplary embodiment, a user may interact with a digital asset design and generation system via a conversational UI, providing an initial description of a desired digital asset. The system may analyze the initial description to determine an intent of the user.

If the user intent satisfies a user intent threshold, then the system may generate and display an initial digital asset based on the initial description. The system may generate a prompt to solicit from the user desired changes to the generated digital asset. This process may continue iteratively until the user is satisfied with the generated digital asset.

If the user intent fails to satisfy a user intent threshold, then the system may generate prompts to solicit additional details about the desired digital asset. Based on the user responses to the prompts, the system may generate refined descriptions until the user intent threshold is satisfied. Once the user intent threshold is satisfied, the system may generate and display an initial digital asset based on the refined description. The system may generate a prompt to solicit from the user desired changes to the initial digital asset. This process may continue iteratively until the user is satisfied with the generated digital asset.

In some embodiments, a digital asset design and generation system may employ at least one artificial intelligence (AI) model (e.g., machine learning (ML) model, such as a large language model (LLM) or a multimodal model). The at least one AI model may be configured to learn and understand user inputs, generate a digital asset based thereon, provide refinement suggestions, generate clarifying questions, and further build on or refine a description of a desired digital asset based on user responses. The at least one AI model may be instructed to generate both user prompts and refined descriptions of the desired digital asset, which the system may provide to the user to guide the user to a desired finalized digital asset. The AI model may generate a new or refined prompt to generate a novel digital asset for each user response. As such, the progression of an idea may easily be viewed or reverted to a previous digital asset at any time.

In an aspect of embodiments, the at least one AI model may be configured to translate descriptions of desired digital assets, enrich the descriptions for styles, provide variations of the descriptions, provide zoom functionalities (e.g., zoom in/zoom out) to digital asset previews, etc.

In another aspect of embodiments, the digital asset design and generation system may leverage an external service by instructing the external service to generate prompts for the user (e.g., CHATGPT), to generate initial or refined descriptions of a desired digital asset (e.g., CHATGPT), and/or to generate digital assets based on an initial or refined description of a desired asset (e.g., DALL-E, MIDJOURNEY, STABLE DIFFUSION).

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments may be practiced without these specific details. In other instances, well known structures and devices are shown in block diagram form in order to facilitate a description thereof. The intention is to cover all modifications, equivalents, and alternatives consistent with the claimed subject matter.

Example System Architecture

FIG. 1 illustrates an environment 100 in which computerized systems, processes, and methods for generating a digital asset through iterative refinement of descriptions of the digital asset may operate or be used, according to some embodiments. Environment 100 may include server(s) 130 communicatively coupled with client device(s) 110 and database 152 over a network 150. One of the server(s) 130 may be configured to host a memory including instructions which, when executed by a processor, cause the server(s) 130 to perform at least some of the steps in methods as disclosed herein. In some embodiments, the processor may be configured to control a graphical user interface (GUI) for the user of one of client device(s) 110 accessing a user intent module (e.g., user intent module 232, FIG. 2), a prompt generation module (e.g., prompt generation module 234, FIG. 2), or a digital asset generation module (e.g., digital asset generation module 236, FIG. 2) with an application (e.g., application 222, FIG. 2). Accordingly, the processor may include a dashboard tool, configured to display components and graphic results to the user via a GUI (e.g., GUI 223, FIG. 2). For purposes of load balancing, multiple servers of server(s) 130 may host memories including instructions to one or more processors, and multiple servers of server(s) 130 may host a history log and a database 152 including multiple training archives for the user intent module, the prompt generation module, or the digital asset generation module. Moreover, in some embodiments, multiple users of client device(s) 110 may access the same user intent module, prompt generation module, or digital asset generation module. In some embodiments, a single user with a single client device (e.g., one of client device(s) 110) may provide images and data (e.g., text) to train one or more machine learning models running in parallel in one or more server(s) 130. Accordingly, client device(s) 110 and server(s) 130 may communicate with each other via network 150 and resources located therein, such as data in database 152.

Server(s) 130 may include any device having an appropriate processor, memory, and communications capability for hosting the user intent module, the prompt generation module, or the digital asset generation module. Any of the user intent module, the prompt generation module, and the digital asset generation module may be accessible by client device(s) 110 over network 150.

Client device(s) 110 may include any one of a laptop computer 110-5, a desktop computer 110-3, or a mobile device, such as a smartphone 110-1, a palm device 110-4, or a tablet device 110-2. In some embodiments, client device(s) 110 may include a headset or other wearable device 110-6 (e.g., a virtual reality headset, augmented reality headset, or smart glass), such that at least one participant may be running an immersive reality application installed therein.

Network 150 may include, for example, any one or more of a local area network (LAN), a wide area network (WAN), the Internet, and the like. Further, network 150 may include, but is not limited to, any one or more of the following network topologies, including a bus network, a star network, a ring network, a mesh network, a star-bus network, tree or hierarchical network, and the like.

A user may own or operate client device(s) 110 that may include a smartphone device 110-1 (e.g., an IPHONE® device, an ANDROID® device, a BLACKBERRY® device, or any other mobile computing device conforming to a smartphone form). Smartphone device 110-1 may be a cellular device capable of connecting to a network 150 via a cell system using cellular signals. In some embodiments and in some cases, smartphone device 110-1 may additionally or alternatively use Wi-Fi or other networking technologies to connect to the network 150. Smartphone device 110-1 may execute a client, Web browser, or other local application to access server(s) 130.

A user may own or operate client device(s) 110 that may include a tablet device 110-2 (e.g., an IPAD® tablet device, an ANDROID® tablet device, a KINDLE FIRE® tablet device, or any other mobile computing device conforming to a tablet form). Tablet device 110-2 may be a Wi-Fi device capable of connecting to a network 150 via a Wi-Fi access point using Wi-Fi signals. In some embodiments and in some cases, tablet device 110-2 may additionally or alternatively use cellular or other networking technologies to connect to network 150. Tablet device 110-2 may execute a client, Web browser, or other local application to access server(s) 130.

The user may own or operate client device(s) 110 that may include a personal computer device 110-5 (e.g., a MAC OS® device, WINDOWS® device, LINUX® device, or other computer device running another operating system). Personal computer device 110-5 may be an Ethernet device capable of connecting to a network 150 via an Ethernet connection. In some embodiments and in some cases, personal computer device 110-5 may additionally or alternatively use cellular, Wi-Fi, or other networking technologies to connect to the network 150. Personal computer device 110-5 may execute a client, Web browser, or other local application to access server(s) 130.

Figure 2:
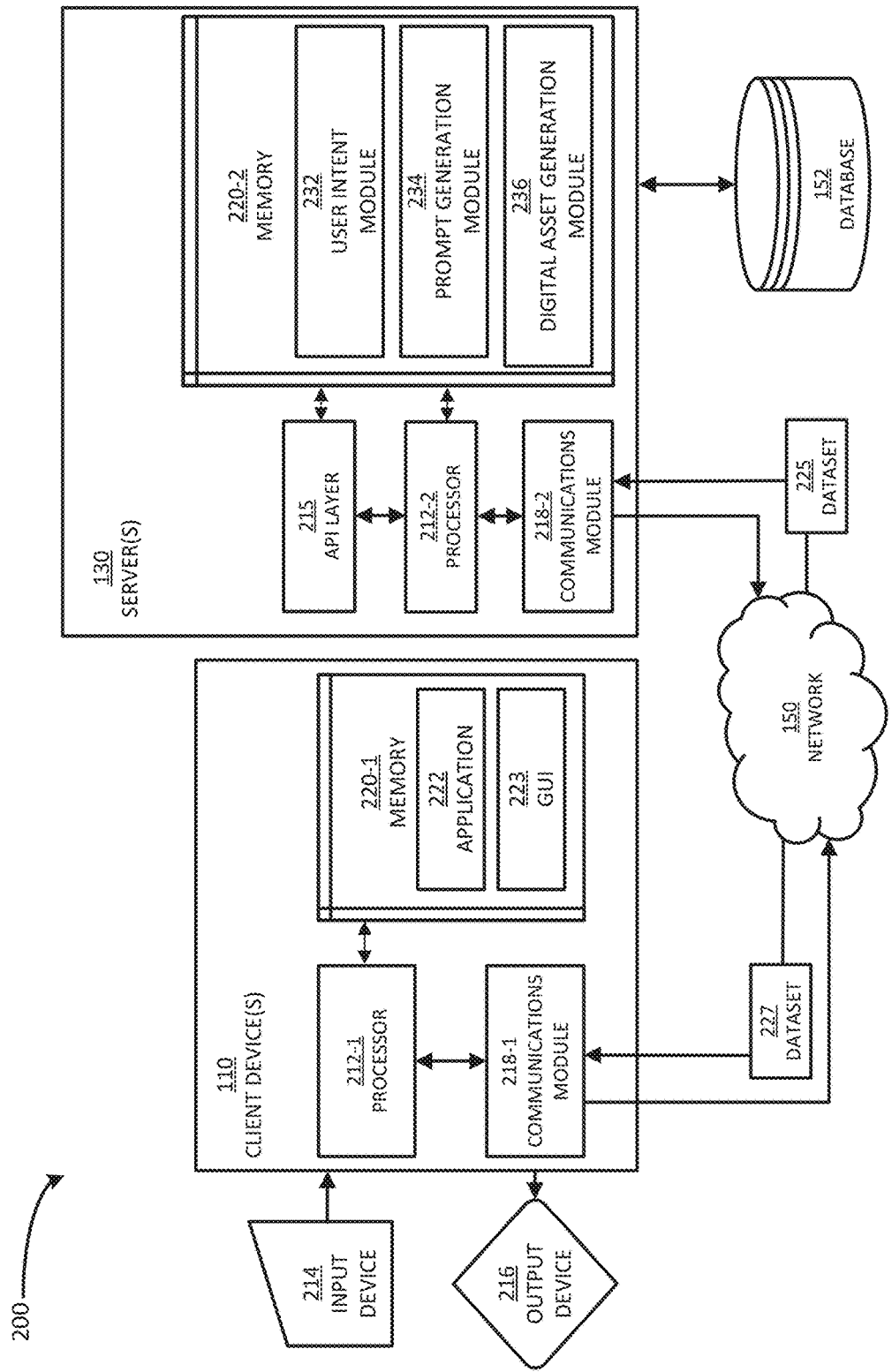
FIG. 2 is a block diagram illustrating details of at least one client device and at least one server that may be used in computerized systems, processes, and methods as disclosed herein, according to some embodiments.

FIG. 2 is a block diagram 200 illustrating details of client device(s) 110 and server(s) 130 that may be used in computerized systems, processes, and methods as disclosed herein, according to some embodiments. Client device(s) 110 and server(s) 130 may be communicatively coupled over network 150 via respective communications modules 218-1 and 218-2 (hereinafter, collectively referred to as "communications modules 218"). Communications modules 218 may be configured to interface with network 150 to send and receive information, such as requests, responses, messages, and commands to other devices on the network in the form of datasets 225 and 227. Communications modules 218 may be, for example, modems or Ethernet cards, and may include radio hardware and software for wireless communications (e.g., via electromagnetic radiation, such as radiofrequency (RF), near field communications (NFC), Wi-Fi, or Bluetooth radio technology). Client device(s) 110 may be coupled with input device 214 and with output device 216. Input device 214 may include a keyboard, a mouse, a pointer, a touchscreen, a microphone, a joystick, a virtual joystick, and the like. In some embodiments, input device 214 may include cameras, microphones, and sensors, such as touch sensors, acoustic sensors, inertial motion units (IMUs), and other sensors configured to provide input data to an AR/VR headset. For example, in some embodiments, input device 214 may include an eye-tracking device to detect the position of a pupil of a user in an AR/VR headset. Likewise, output device 216 may include a display and a speaker with which the customer may retrieve results from client device(s) 110. Client device(s) 110 may also include a processor 212-1, configured to execute instructions stored in a memory 220-1, and to cause client device(s) 110 to perform at least some of the steps in methods consistent with the present disclosure. Memory 220-1 may further include an application 222 and a graphical user interface (GUI) 223, configured to run in client device(s) 110 and couple with input device 214 and output device 216. Application 222 may be downloaded by the user from server(s) 130 and may be hosted by server(s) 130. In some embodiments, client device(s) 110 may be an AR/VR headset and application 222 may be an immersive reality application. In some embodiments, client device(s) 110 may be a mobile phone used to collect a video or picture and upload to server(s) 130 using a video or image collection application (e.g., application 222), to store in database 152. In some embodiments, application 222 may run on any operating system (OS) installed in client device(s) 110. In some embodiments, application 222 may run out of a Web browser, installed in client device(s) 110.

Dataset 227 may include multiple messages and multimedia files. A user of client device(s) 110 may store at least some of the messages and data content in dataset 227 in memory 220-1. In some embodiments, a participant may upload, with client device(s) 110, dataset 225 onto server(s) 130, as part of a messaging interaction (or conversation, or "chat"). Accordingly, dataset 225 may include a message from the participant, or a multimedia file that the participant wants to share in a conversation.

A database 152 may store data and files associated with a conversation (or "chat") from application 222 (e.g., one or more of datasets 225 and 227).

Server(s) 130 may include application programming interface (API) layer 215, which may control application 222 in each of client device(s) 110. Server(s) 130 may also include a memory 220-2 storing instructions which, when executed by a processor 212-2, cause server(s) 130 to perform at least partially one or more operations in methods consistent with the present disclosure.

Processors 212-1 and 212-2 and memories 220-1 and 220-2 will be collectively referred to, hereinafter, as "processors 212" and "memories 220," respectively.

Processors 212 may be configured to execute instructions stored in memories 220. In some embodiments, memory 220-2 may include user intent module 232, prompt generation module 234, or digital asset generation module 236. User intent module 232, prompt generation module 234, or digital asset generation module 236 may share or provide features and resources to GUI 223. A user may access user intent module 232, prompt generation module 234, or digital asset generation module 236 through application 222, installed in a memory 220-1 of client device(s) 110. Accordingly, application 222, including GUI 223, may be installed by server(s) 130 and perform scripts and other routines provided by server(s) 130 through any one of multiple tools. Execution of application 222 may be controlled by processor 212-1.

User intent module 232 may be designed to understand and interpret user input (e.g., requests, commands, questions, or the like) regarding a desired digital asset. User intent module 232 may interpret a user input, which may be in the form of text, voice, gesture, or visual cue. User intent module 232 may use natural language processing (NLP) techniques to determine a user intent from the user input. User intent module 232 may determine whether a user intent satisfies (e.g., meets, exceeds, extends beyond) a user intent threshold. A user intent threshold may include a level (or degree, magnitude, or the like) of clarity or specificity of a user intent. For example, a user intent threshold may include a level of clarity or specificity of at least one of an intended use of a desired digital asset (e.g., for a vacation scrapbook, for a company website) and a characteristic of a desired digital asset (e.g., a theme, a style, a subject, a content, a feature, a quality, a variation, or the like).

Prompt generation module 234 may be designed to generate prompts (e.g., questions, instructions, suggestions, ideas, descriptions, acknowledgments, or the like) that guide the creative process of a user. Prompt generation module 234 may use NLP techniques to generate prompts. Prompts may vary in complexity or detail. For example, a user may request an image of a sunset over a city skyline, and prompt generation module 234 may generate questions about the position of the sun, the colors of the sky, the presence of clouds, the region of the city, and the like. Prompt generator module 234 may generate digital asset description prompts that solicit from a user further detail about a desired digital asset (e.g., "How many flowers should the vase hold?"). Prompt generator module 234 may generate status prompts regarding the digital asset generation process (e.g., "Your request is being processed," "Your image is being generated," "I am creating your image now," "Working . . . "). Prompt generation module 234 may generate a prompt based on a determination (e.g., by user intent module 232) that a user intent satisfies a user intent threshold; may generate a prompt based on a determination (e.g., by user intent module 232) that a user intent fails to satisfy a user intent threshold; or may generate a prompt based on a generation (e.g., by digital asset generation module 236) of a desired digital asset for display. Prompt generation module 234 may iteratively refine the prompts or the description of a desired digital asset until a generated digital asset aligns with the idea, goal, or concept of the user. A prompt may be provided to a user and a user input may be received from the user via a conversational user interface (UI) of a design assistant application (e.g., application 222).

Digital asset generation module 236 may generate a desired digital asset according to an initial or a refined description of the desired digital asset. Digital asset generation module 236 may use multimodal generative models (e.g., text-to-image models, text-to-video models, text-to-audio models, audio-to-image models, audio-to-video models, or the like) to generate a desired digital asset. A generated digital asset (e.g., a tree) may include an initial generated digital asset (e.g., the tree) or updates to (or revisions of, or regenerations of) the generated digital asset (e.g., the tree with birds added), the updates made according to refined descriptions of the desired digital asset (e.g., "Add birds to the tree.").

In some embodiments, a design assistant application (e.g., application 222) of a digital asset design and generation system (e.g., environment 100) may include an interface used for an automated digital asset generation process. All creative visuals, digital asset descriptions, and digital asset outputs may be displayed via the interface. A first panel may include a conversational user interface (e.g., conversational user interface (UI) 510), by which the design assistant application may provide prompts to the user and may receive inputs from the user. A user may, via interactive elements of the conversational UI, restart a chat (e.g., via Restart Chat button 512), or provide feedback about the design assistant application (e.g., via Feedback button 514). In some embodiments, a second panel may include a digital asset editor (e.g., image editor 550) for digital asset editing. A user may, via interactive elements of the digital asset editor, download a generated digital asset to a device of the user (e.g., via Download button 554); save a generated digital asset to a catalog associated with a user account of the user (e.g., via Save button 556); edit a generated digital asset (e.g., via Edit button 560); expand or broaden a scope of a generated digital asset (e.g., via Expand button 562); request alternative versions of a generated digital asset (e.g., via Variations button 564); convey a positive or a negative opinion of a generated digital asset (e.g., via Like/Dislike button 568); or view a history of generated digital assets (e.g., via History buttons 570).

In further aspects, the conversational UI may prompt a user with a message to initiate a digital asset design and generation session (e.g., a greeting or the like). For example, the conversational UI may invite the user to "describe your subject or use case to get started." The prompt may be displayed in the first panel of the design assistant application.

In further aspects, the design assistant application may be configured to receive an input (e.g., text, voice, gesture, visual cue) from a user. The user input may include an initial description of a desired digital asset, an unsolicited input, a solicited response to a prompt from the design assistant application, or an unsolicited response to a prompt from the design assistant application. The user input may describe a digital asset the user would like the design assistant to generate, or a creative task the user would like the design assistant to complete. The user input may take many semantic and grammatical forms. By non-limiting example, the user may input a text or audio command for "a black-and-white photo of a dog." Other examples of text or audio input may include the following: "I need something that can be used to illustrate a blog post about hillwalking"; "Show me something that evokes a smoky, gloomy mood." A digital asset may be generated (e.g., by digital asset generation module 236) based on the user input using an AI model (e.g., a text-to-image model, a text-to-video model, a text-to-audio model, an audio-to-image model, an audio-to-video models, or the like).

In further aspects, a generated digital asset may be displayed to the user via a digital asset editor of the second panel of the design assistant application. In some implementations, embodiments include providing to the user, via the conversational UI, a confirmation message (e.g., "Image is ready"). At that point, the design assistant application may prompt the user, via the conversational UI, to solicit feedback on how the generated digital asset may be improved. The prompts may include leading questions about the style and content of the generated digital asset. As non-limiting example, the design assistant application may ask a user, regarding a generated image of a dog, about whether the generated image should include a particular breed of dog, whether the generated image should be in a particular style, whether the contrast of the generated image should be increased, whether the generated image should be a close-up image, etc. The design assistant application may provide description suggestions or description requests that may guide the user to a final product even if the user is unsure of exactly what the user wants.

In further aspects, user input and generated digital assets may be analyzed using AI models. For example, based on user input, a description of a digital asset may be iteratively refined to reflect user responses to prompts regarding the digital asset. A digital asset may be generated and displayed to the user for each iteration of a refined description of the digital asset wherein a user intent determined from the refined description satisfies a user intent threshold. An AI model may be configured to learn the user over time and to provide personalized ideas and suggestions. As such, the design assistant application may act as an expert at describing digital assets, prompting the user for input ideas, and providing examples independently when the user is unsure. In this manner, the design assistant application may act as a "creative concierge" for the design process of a user.

In further aspects, digital asset editing tools may be integrated into the digital asset editor of the design assistant application and may be triggered by a user selecting a button (e.g., Edit button 560). In some implementations, a digital asset editing tool may be triggered via text instructions provided from the user via the conversational UI. For example, the user may instruct the design assistant application to "generate variations" or "zoom out a bit," etc.

In further aspects, the digital asset design and generation steps may continue until the user is satisfied with the generated digital asset. Once the user is satisfied, the user may download a finalized digital asset using the design assistant application (e.g., by selecting a download button of the digital asset editor). The user may save the finalized digital asset to a catalog associated with a user account of the user (e.g., by selecting a save button of the digital asset editor). The user may further edit the finalized digital asset or may revert back to a previously displayed generated digital asset. In some embodiments, the user may share the finalized digital asset using the design assistant application (e.g., by selecting a share icon of the digital asset editor).

Figure 3:
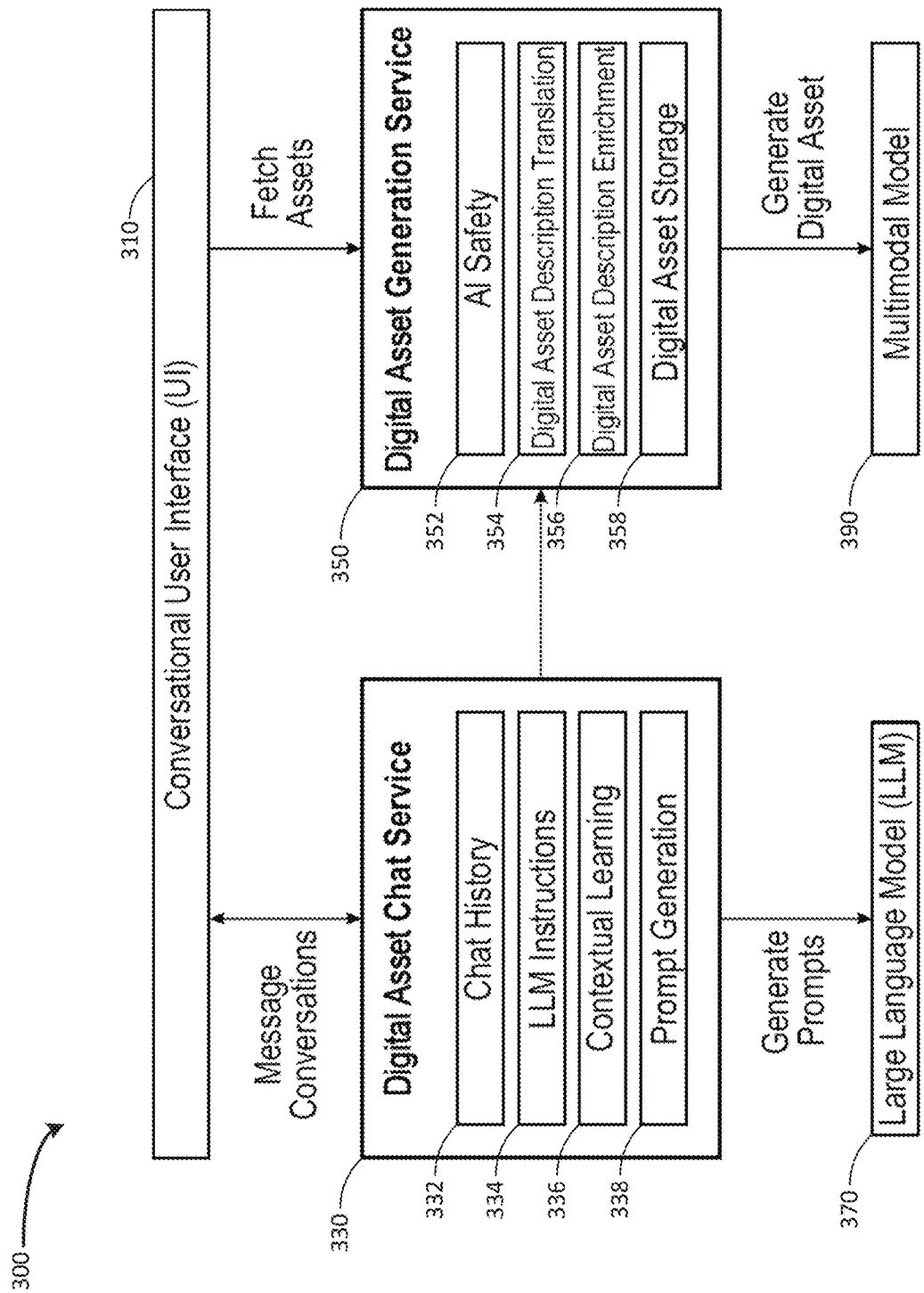
FIG. 3 is a block diagram illustrating a system for generating a digital asset through iterative refinement of descriptions of the digital asset, according to some embodiments.

FIG. 3 is a block diagram illustrating a system 300 for generating a digital asset through iterative refinement of descriptions of the digital asset, according to some embodiments. System 300 may include conversational user interface (UI) 310, digital asset chat service 330, digital asset generation service 350, large language model (LLM) 370, and multimodal model 390. LLM 370 may include one or more LLM models leveraged by digital asset chat service 330, and multimodal model 390 may include one or more multimodal models leveraged by digital asset generation service 350.

Digital asset chat service 330 may include chat history 332, LLM instructions 334, contextual learning 336, and prompt generation 338. Digital asset chat service 330 may both receive user input messages and provide generated prompts via conversational UI 310. Upon digital asset chat service 330 receiving an initial user input (e.g., "I want to make an image of a graduation ceremony."), chat history 332 may create a chat identification (ID) and assign the initial user input and all subsequent user inputs to the chat ID, creating a history of the conversation between a user and the system. Digital asset chat service 330 may send a user input to LLM 370 via a first call to an application programming interface (API) of LLM 370. The user input may include an initial or a refined description of a desired digital asset. LLM 370 may return an acknowledgement of whether the user input has been received or understood. In some embodiments, LLM 370 may, according to instructions provided by LLM instructions 334, return an acknowledgement of whether the user input violates a terms of use of system 300. The instructions may require LLM 370 to return a response formatted in a predetermined manner. For example, the instructions may require LLM 370 to return a string of text with fields populated by LLM 370. If the user input has been received and understood according to the response of LLM 370 to the first API call, then digital asset chat service 330 may process the user input by wrapping the user input in a context that includes instructions for LLM 370 about the content and the format of the next response LLM 370 should return. The context may include at least one of the current understanding of the user intent, the current description of the desired digital asset, the last prompt LLM 370 proposed, and the response of the user to the last prompt LLM 370 proposed. The content of the response LLM 370 should return may include a proposed prompt or an updated digital asset description. The instructions may require LLM 370 to return a response formatted in a predetermined manner. For example, the instructions may require LLM 370 to return a string of text with fields populated by LLM 370 such that digital asset chat service 330 may understand the response from LLM 370 and may update (or refine) the user input based on the response. Each call to an API of LLM 370 may include updates to the contextual elements of the user input (e.g., the current understanding of the user intent, the current description of the desired digital asset, the last prompt LLM 370 proposed, the response of the user to the last prompt LLM 370 proposed).

If digital asset chat service 330 determines a user intent satisfies a user intent threshold, then digital asset chat service 330 may send the user input to digital asset generation service 350. Digital asset generation service 350 may provide a generated digital asset to a user via conversational UI 310. Digital asset chat service 330 may generate a prompt to solicit from the user desired changes or improvements to the generated digital asset. This process may continue iteratively until the user is satisfied with the generated digital asset.

If digital asset chat service 330 determines a user intent fails to satisfy a user intent threshold, then prompt generation 338 may solicit from the user additional details about the desired digital asset using proposed prompts generated by LLM 370. Based on the user responses to the prompts, digital asset chat service 330 may continue using LLM 370 to generate refined descriptions of the desired digital asset until the user intent threshold is satisfied. Once the user intent threshold is satisfied, digital asset chat service 330 may send the refined description of the desired digital asset to digital asset generation service 350. Digital asset generation service 350 may provide a generated digital asset to a user via conversational UI 310. Digital asset chat service 330 may generate a prompt to solicit from the user desired changes or improvements to the generated digital asset. This process may continue iteratively until the user is satisfied with the generated digital asset.

Digital asset generation service 350 may include artificial intelligence (AI) safety 352, digital asset description translation 354, digital asset description enrichment 356, and digital asset storage 358. Digital asset description translation 354 may translate a digital asset description such that the digital asset description may be understood by multimodal model 390. Digital asset description enrichment 356 may enrich a digital asset description (e.g., with additional detail or structure) such that multimodal model 390 may more accurately generate a desired digital asset according to the description of the desired digital asset.

Digital asset generation service 350 may provide a digital asset description to multimodal model 390 via a call to an API of multimodal model 390. Multimodal model 390 may generate a desired digital asset according to the description of the desired digital asset. Digital asset generation service 350 may provide a generated digital asset to a user via conversational UI 310. Digital asset generation service 350 may receive, via conversational UI 310, fetch requests for a current or a previously generated digital asset. Current and previously generated digital assets may be stored by digital asset storage 358.

Figure 4:
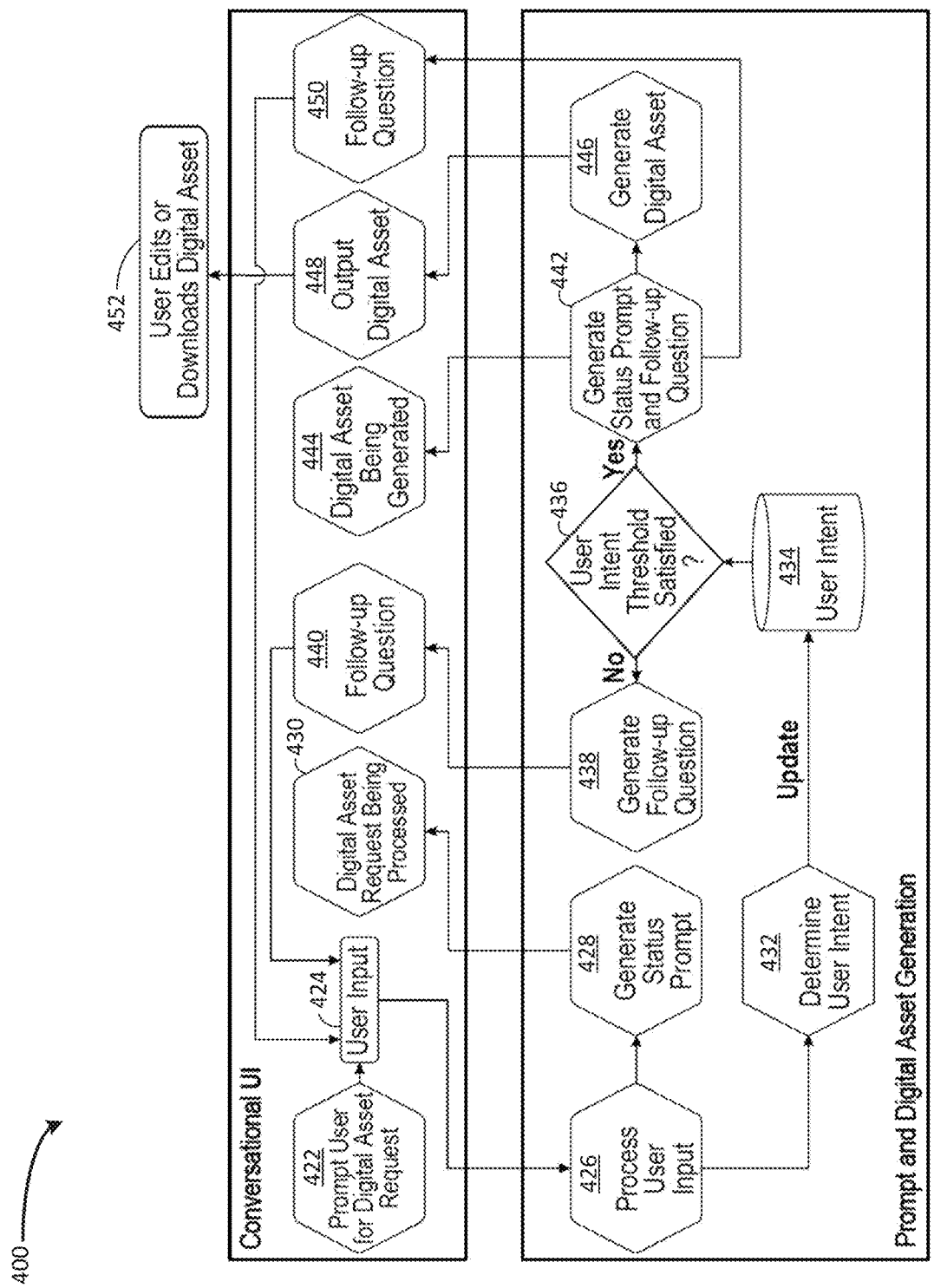
FIG. 4 is a flowchart illustrating a process for generating a digital asset through iterative refinement of descriptions of the digital asset, according to some embodiments.

FIG. 4 is a flowchart illustrating a process 400 for generating a digital asset through iterative refinement of descriptions of the digital asset, according to some embodiments. In some embodiments, processes as disclosed herein may include one or more steps in process 400 performed by a processor circuit executing instructions stored in a memory circuit, in a client device, a remote server or a database, communicatively coupled through a network (e.g., processors 212, memories 220, client device(s) 110, server(s) 130, database 152, and network 150). In some embodiments, one or more of the steps in process 400 may be performed by a user intent module, a prompt generation module, or a digital asset generation module, as disclosed herein (e.g., user intent module 232, prompt generation module 234, or digital asset generation module 236). In some embodiments, processes consistent with the present disclosure may include at least one or more steps as in process 400 performed in a different order, simultaneously, quasi-simultaneously, or overlapping in time.

At step 422, a prompt may be provided to a user, via a conversational UI, soliciting from the user a digital asset request. In some embodiments, the prompt may include a question, an instruction, a suggestion, or an idea to solicit from the user a description of a desired digital asset including at least one of an intended use of the desired digital asset (e.g., for a vacation scrapbook, for a company website) and a characteristic of the desired digital asset (e.g., a theme, a style, a subject, a content, a feature, a quality, a variation, or the like).

At step 424, a user input may be received via a conversational UI. In some embodiments, the user input may be in the form of text, voice, gesture, visual cue, or the like. In some embodiments, the user input may include a digital asset request. The digital asset request may include a description of a desired digital asset (e.g., "Show me a rural snow scene for my family calendar."). In some embodiments, the user input may include additional detail associated with a previous digital asset request. For example, a first user input may include a digital asset request for "an image of a dining table," and a second user input may include "add diners seated around the dining table."

At step 426, the user input may be processed. In some embodiments, the processing of the user input may include determining whether the user input includes a valid user input. For example, a valid user input may comply with a terms of use agreement; an invalid user input may violate a terms of use agreement. In another example, a valid user input may include a description of a desired digital asset (e.g., an initial description of a desired digital asset or additional detail to clarify the initial description); an invalid user input may not include a description of a desired digital asset.

At step 428, a status prompt may be generated. In some embodiments, the status prompt may convey whether a user input is valid or invalid. In some embodiments, the status prompt may convey whether a digital asset request can be processed or cannot be processed, or whether the digital asset request is being processed or is not being processed.

At step 430, a status prompt may be provided to a user via a conversational UI. The status prompt may include a status prompt generated at step 428. In some embodiments, a status prompt may be provided to the user in the form of text, voice, or animation.

At step 432, a user intent may be determined from a user input. In some embodiments, the user intent may include at least one of an intended use of the desired digital asset (e.g., for a vacation scrapbook, for a company website) and a characteristic of the desired digital asset (e.g., a theme, a style, a subject, a content, a feature, a quality, a variation, or the like).

At step 434, a user intent database may be updated with a current user intent. The user intent database may include previous user intents.

At step 436, based on a user intent history including a current user intent and any previous user intents, it may be determined whether a user intent satisfies a user intent threshold. A user intent threshold may include a level (or degree, magnitude, or the like) of clarity or specificity of a user intent. For example, a user intent threshold may include a level of clarity or specificity of at least one of an intended use of a desired digital asset (e.g., for a vacation scrapbook, for a company website) and a characteristic of a desired digital asset (e.g., a theme, a style, a subject, a content, a feature, a quality, a variation, or the like).

At step 438, if a user intent fails to satisfy a user intent threshold, then a follow-up prompt may be generated. The follow-up prompt may include at least one of a question, an instruction, a suggestion, or an idea to solicit from the user additional detail about a desired digital asset including at least one of an intended use of the desired digital asset (e.g., for a vacation scrapbook, for a company website) and a characteristic of the desired digital asset (e.g., a theme, a style, a subject, a content, a feature, a quality, a variation, or the like).

At step 440, a follow-up prompt may be provided to the user via a conversational UI. The follow-up prompt may include a follow-up prompt generated at step 438. In some embodiments, a follow-up prompt may be provided to the user in the form of text, voice, or animation.

At step 442, if a user intent satisfies a user intent threshold, then a status prompt may be generated, and a follow-up prompt may be generated. In some embodiments, the status prompt may convey whether a user intent satisfies a user intent threshold. In some embodiments, the status prompt may convey whether a digital asset is being or will be generated. In some embodiments, the follow-up prompt may include at least one of a question, an instruction, a suggestion, or an idea to solicit from the user desired changes or improvements to a generated digital asset. A desired change or improvement to a generated digital asset may be directed to an intended use of the generated digital asset (e.g., for a vacation scrapbook, for a company website) or a characteristic of the generated digital asset (e.g., a theme, a style, a subject, a content, a feature, a quality, a variation, or the like).

At step 444, a status prompt may be provided to a user via a conversational UI. The status prompt may include a status prompt generated at step 442. In some embodiments, a status prompt may be provided to the user in the form of text, voice, or animation.

At step 446, a digital asset may be generated according to a user input.

At step 448, a digital asset may be output via a conversational UI. The digital asset may include a digital asset generated at step 446. In some embodiments, a digital asset may be output in the form of an image, a video, an audio, a document, an interactive content, a multimedia file, or the like.

At step 450, a follow-up prompt may be provided to the user via a conversational UI. The follow-up prompt may include a follow-up prompt generated at step 442. In some embodiments, a follow-up prompt may be provided to the user in the form of text, voice, or animation.

At step 452, a user may edit or download an output digital asset. The output digital asset may include the digital asset output at step 448.

Figure 5:
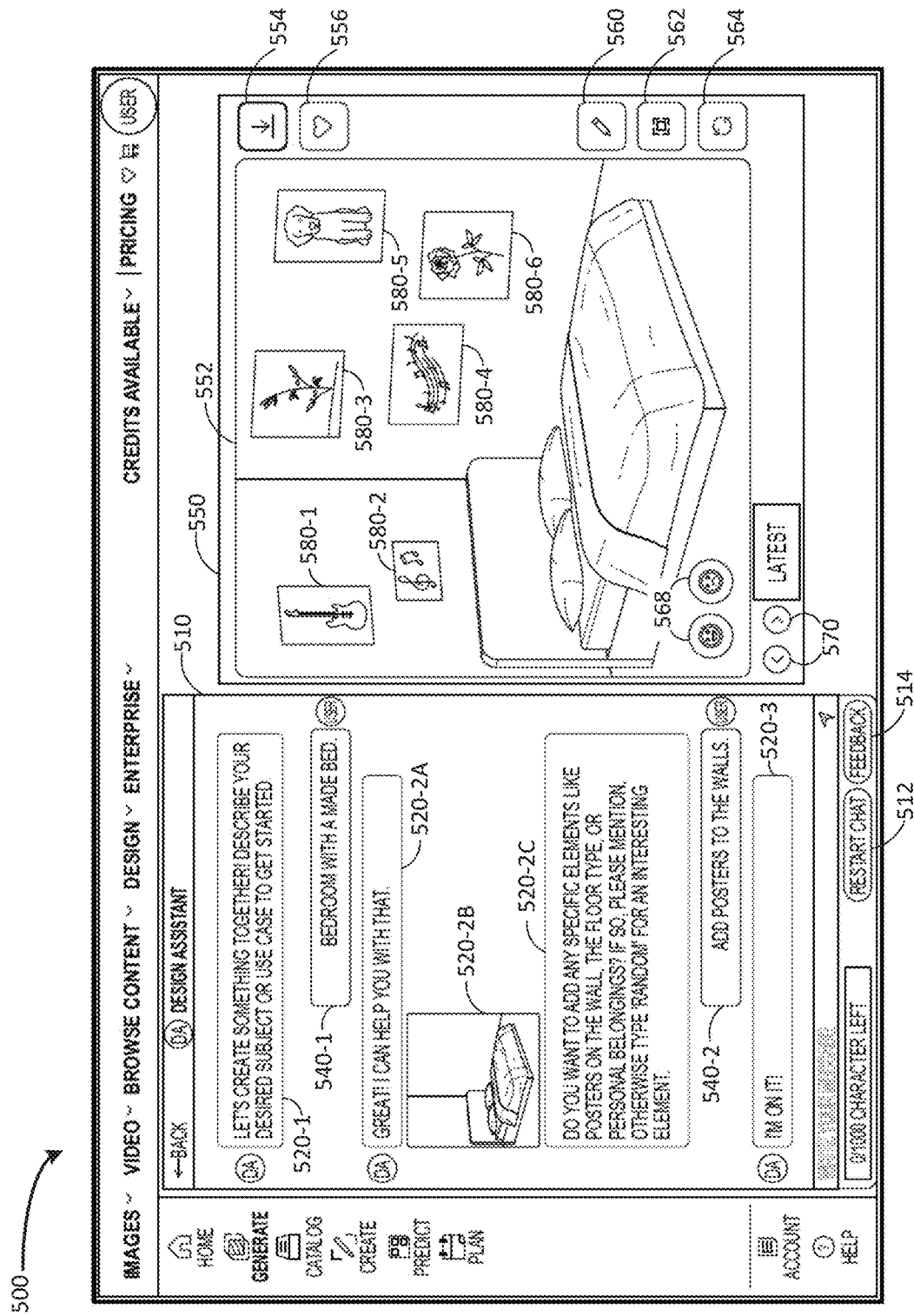
FIG. 5 illustrates an example view of a design assistant application configured for generating a digital asset, wherein the digital asset comprises an image, through iterative refinement of descriptions of the digital asset, according to some embodiments.

FIG. 5 illustrates an example view 500 of a design assistant (DA) application configured for generating a digital asset, wherein the digital asset comprises an image, through iterative refinement of descriptions of the digital asset, according to some embodiments. In other embodiments, the digital asset of FIG. 5 could also include a video, an audio, a document, an interactive content, a multimedia file, or the like. As shown in example view 500, the DA application may include an interface used for an automated digital asset generation process. All creative visuals, digital asset descriptions, and digital asset outputs may be displayed via the interface.

A first panel of example view 500 includes conversational user interface (UI) 510, by which the DA application may provide prompts to the user and may receive inputs from the user. Conversational UI 510 includes the following: DA prompt 520-1, DA prompt 520-2A, DA prompt 520-2B, DA prompt 520-2C, and DA prompt 520-3 (hereinafter, collectively referred to as "DA prompts 520"); user input 540-1 and user input 540-2 (hereinafter, collectively referred to as "user inputs 540"); Restart Chat button 512; and Feedback button 514.

As shown in FIG. 5, DA prompt 520-1 may be provided to a user, via conversational UI 510, soliciting from the user a description of a desired image: "Let's create something together! Describe your desired subject or use case to get started." User input 540-1 includes an image request with a description of a desired image: "Bedroom with a made bed." A user intent may be determined from user input 540-1, and a user intent database may be updated with the user intent determined from user input 540-1. Based on a user intent history including the current user intent and any previous user intents, it may be determined whether a user intent satisfies a user intent threshold.

If a user intent satisfies a user intent threshold, then DA prompt 520-2A, which includes a status prompt ("Great! I can help you with that."), DA prompt 520-2B, which includes a preview of an image generated according to the description of the desired image, and DA prompt 520-2C, which includes a follow-up prompt ("Do you want to add any specific elements like posters on the wall, the floor type, or personal belongings? If so, please mention, otherwise type 'random' for an interesting element."), may be generated and may be provided to the user via conversational UI 510. DA prompt 520-2A conveys that the user intent satisfies a user intent threshold. DA prompt 520-2C conveys a question, an instruction, a suggestion, or an idea to solicit from the user desired changes or improvements to the generated image previewed in prompt 520-2B. In some embodiments, the image generated according to the description of the desired image may be displayed in an image editor (e.g., image editor 550). User input 540-2 includes additional detail regarding the generated image: "Add posters to the walls." As similarly described above for user input 540-1, a user intent may be determined from user input 540-2, and a user intent database may be updated with the user intent determined from user input 540-2. Based on a user intent history including the current user intent and any previous user intents, it may be determined whether a user intent satisfies a user intent threshold.

If a user intent satisfies a user intent threshold, then DA prompt 520-3, which includes a status prompt ("I'm on it!"), may be generated and may be provided to the user via conversational UI 510. In some embodiments, an image generated according to the additional details of user input 540-2 (e.g., generated image 552) may be displayed to the user via conversational UI 510. In some embodiments, an image generated according to the additional details of user input 540-2 (e.g., generated image 552) may be displayed to the user via an image editor (e.g., image editor 550). Generated image 552 may include poster 580-1, poster 580-2, poster 580-3, poster 580-4, poster 580-5, and poster 580-6 (hereinafter, collectively referred to as "posters 580"). The user may be prompted with further questions, instructions, suggestions, or ideas to solicit from the user desired changes or improvements to an image generated according to the additional details of user input 540-2 (e.g., generated image 552). This iterative process may be utilized to incrementally refine the description of the desired image until an image may be generated that aligns with the idea, goal, or concept of the user, thereby enhancing the overall design and generation experience. In some embodiments, when a user selects Restart Chat button 512, the chat may be cleared, and a new image generation process may begin. In some embodiments, when a user selects Feedback button 514, the user may be enabled (e.g., via a pop-up window) to provide feedback about the design assistant application.

In some embodiments, a second panel of example view 500 may include image editor 550 for image editing. Image editor 550 may include generated image 552, posters 580, Download button 554, Save button 556, Edit button 560, Expand button 562, Variations button 564, Like/Dislike buttons 568, and History buttons 570. When a user selects Download button 554, generated image 552 may be downloaded to a device of the user (e.g., client device(s) 110). When a user selects Save button 556, generated image 552 may be saved to a catalog associated with a user account of the user. When a user selects Edit button 560, tools for manipulating generated image 552 (e.g., changing a color or configuration of generated image 552) may appear. When a user selects Expand button 562, a user may be provided with at least one broadened version (e.g., zoomed-out version) of a generated image, wherein the broadened version may maintain the central elements of the generated image. For example, an original generated image may include a person floating in water with one shark swimming around the person. A first broadened version of the original generated image may include the person and the one shark, but may "zoom out" of the original generated image to show a dozen more sharks swimming around the person. A second broadened version of the original generated image may include the person and the shark, but may "zoom out" of the original image to show the person and the shark are in a backyard swimming pool. When a user selects Variations button 564, a user may be provided with alternative versions of generated image 552. For example, an original version of a generated image may include three tacos with a sauce and a lime wedge on the side. Alternative versions of the original image may include a first alternative version with beans included on the side, a second alternative version with only two tacos, and a third alternative version without the sauce on the side. When a user selects Like/Dislike buttons 568, the user may convey a positive opinion or a negative opinion of generated image 552. When a user selects History buttons 570, a user may scroll through and view a history of generated images, which may be displayed in image editor 550.

In some embodiments, image editor 550 may include a Share button. When a user selects the Share button, a generated image may be forwarded (e.g., to another user of the DA application, to a social media platform, to an email account). In some embodiments, image editor 550 may include a Highlight button. When a user selects the Highlight button, the user may be enabled to indicate with a tool cursor (e.g., with a paintbrush tool cursor, a highlighter tool cursor, a free-form selection tool cursor (such as a lasso tool cursor)) an area of a generated image that a user wishes to modify (e.g., add to, replace, or remove). For example, a generated image may include a wedding reception. A user may highlight a centerpiece situated on a table shown in the image. Via a conversational UI (e.g., conversational UI 510), the user may provide a user input that conveys a desire of the user to remove the centerpiece. Based on the highlighting and the user input, the generated image may be updated such that the centerpiece may be removed. In some embodiments, image editor 550 may include a Background Remover button. When a user selects the Background Remover button, the user may be enabled to outline (e.g., with a cursor) an area of a generated image that the user wishes to keep. The area outside of the outlined area may be considered the background of the generated image. Via a conversational UI (e.g., conversational UI 510), the user may provide a user input that conveys a desire of the user to replace the background of the generated image with a different background. Based on the outlining and the user input, the generated image may be updated such that the background of a generated image may be replaced according to the user input.

Figure 6:
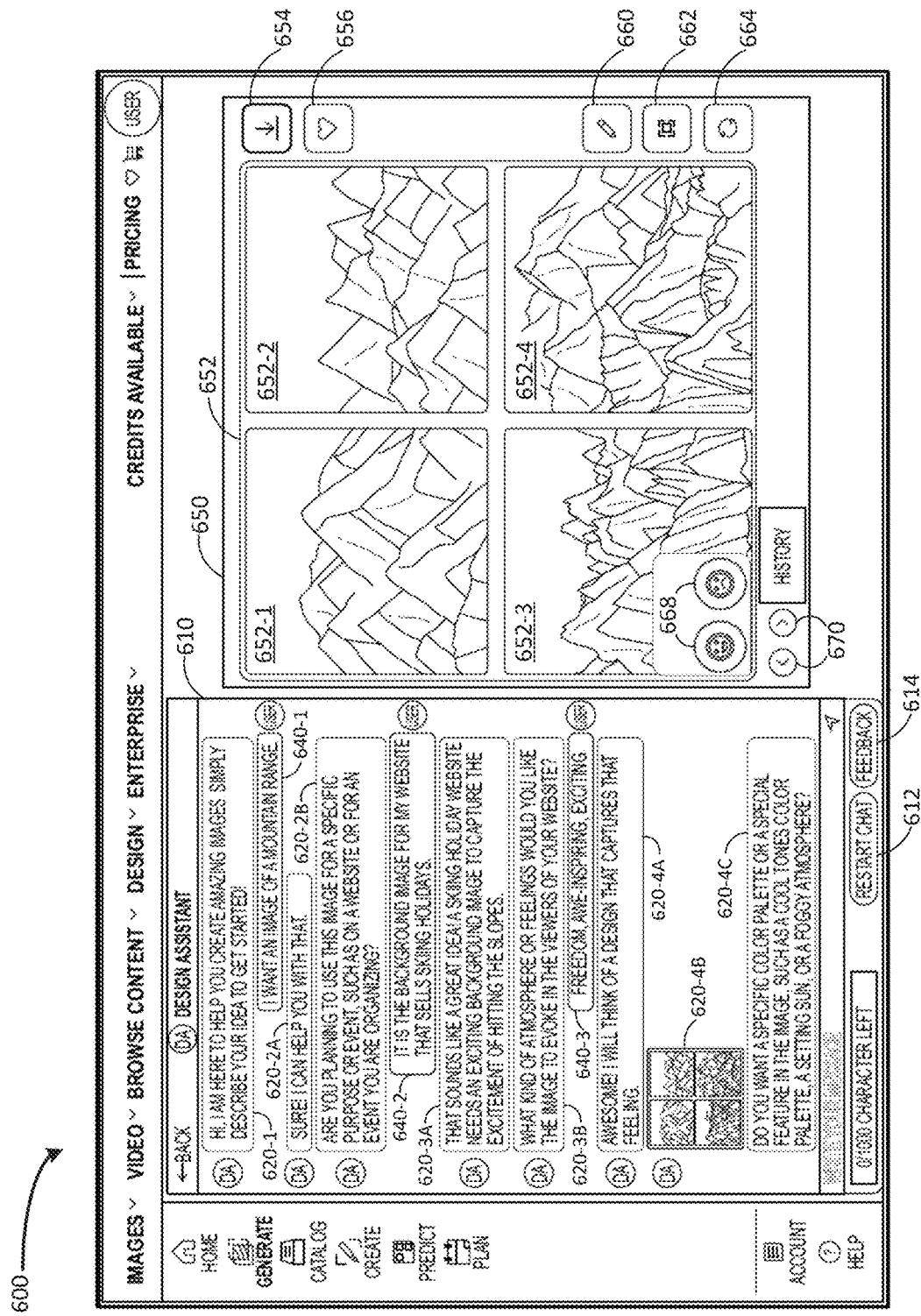
FIG. 6 illustrates an example view of a design assistant application configured for generating a digital asset, wherein the digital asset comprises an image, through iterative refinement of descriptions of the digital asset, according to some embodiments.

FIG. 6 illustrates an example view 600 of a design assistant (DA) application configured for generating a digital asset, wherein the digital asset comprises an image, through iterative refinement of descriptions of the digital asset, according to some embodiments. In other embodiments, the digital asset of FIG. 6 could also include a video, an audio, a document, an interactive content, a multimedia file, or the like. As shown in example view 600, the DA application may include an interface used for an automated digital asset generation process. All creative visuals, digital asset descriptions, and digital asset outputs may be displayed via the interface.

A first panel of example view 600 includes conversational user interface (UI) 610, by which the DA application may provide prompts to the user and may receive inputs from the user. Conversational UI 610 includes the following: DA prompt 620-1, DA prompt 620-2A, DA prompt 620-2B, DA prompt 620-3A, DA prompt 620-3B, DA prompt 620-4A, DA prompt 620-4B, and DA prompt 620-4C (hereinafter, collectively referred to as "DA prompts 620"); user input 640-1, user input 640-2, and user input 640-3 (hereinafter, collectively referred to as "user inputs 640"); Restart Chat button 612; and Feedback button 614.

As shown in FIG. 6, DA prompt 620-1 may be provided to a user, via conversational UI 610, soliciting from the user a description of a desired image: "Hi, I am here to help you create amazing images. Simply describe your idea to get started!" User input 640-1 includes an image request with a description of a desired image: "I want an image of a mountain range." A user intent may be determined from user input 640-1, and a user intent database may be updated with the user intent determined from user input 640-1. Based on a user intent history including the current user intent and any previous user intents, it may be determined whether a user intent satisfies a user intent threshold.

If a user intent fails to satisfy a user intent threshold, then DA prompt 620-2A and DA prompt 620-2B (hereinafter, collectively referred to as "DA prompts 620-2"), which include follow-up prompts, may be generated. DA prompts 620-2 include at least one of a question, an instruction, a suggestion, or an idea to solicit from the user additional detail about a desired digital asset including an intended use of the desired digital asset: "Sure! I can help you with that. Are you planning to use this image for a specific purpose or event, such as on a website or for an event you are organizing?" User input 640-2 includes additional detail regarding the desired image: "It is the background image for my website that sells skiing holidays." As similarly described above for user input 640-1, a user intent may be determined from user input 640-2, and a user intent database may be updated with the user intent determined from user input 640-2. Based on a user intent history including the current user intent and any previous user intents, it may be determined whether a user intent satisfies a user intent threshold.

If a user intent fails to satisfy a user intent threshold, then DA prompt 620-3A and DA prompt 620-3B (hereinafter, collectively referred to as "DA prompts 620-3"), which include follow-up prompts, may be generated. DA prompts 620-3 include at least one of a question, an instruction, a suggestion, or an idea to solicit from the user additional detail about a desired digital asset including a characteristic of the desired digital asset: "That sounds like a great idea! A skiing holiday website needs an exciting background image to capture the excitement of hitting the slopes. What kind of atmosphere or feelings would you like the image to evoke in the viewers of your website?" User input 640-3 includes additional detail regarding the desired digital asset: "Freedom, awe-inspiring, exciting." As similarly described above for user inputs 640-1 and 640-2, a user intent may be determined from user input 640-3, and a user intent database may be updated with the user intent determined from user input 640-3. Based on a user intent history including the current user intent and any previous user intents, it may be determined whether a user intent satisfies a user intent threshold.

If a user intent satisfies a user intent threshold, then DA prompt 620-4A, which includes a status prompt ("Awesome! I will think of a design that captures that feeling."), DA prompt 620-4B, which includes a preview of an image generated according to the description of the desired image (i.e., generated image 652), and DA prompt 620-4C, which includes a follow-up prompt ("Do you want a specific color palette or a special feature in the image, such as a cool tones color palette, a setting sun, or a foggy atmosphere?"), may be generated and may be provided to the user via conversational UI 610. DA prompt 620-4A conveys that the user intent satisfies a user intent threshold. DA prompt 620-4C conveys a question, an instruction, a suggestion, or an idea to solicit from the user desired changes or improvements to generated image 652 previewed in prompt 620-4B and, in some embodiments, displayed in an image editor (e.g., image editor 650). Generated image 652 includes generated image option 652-1, generated image option 652-2, generated image option 652-3, and generated image option 652-4. A user may select at least one of generated image options 652-1, 652-2, 652-3, and 652-4. The user may be prompted with questions, instructions, suggestions, or ideas to solicit from the user desired changes or improvements to a selected generated image option. A user may provide a user input including desired changes or improvements to the selected generated image option (e.g., "Add a rising sun.") As similarly described above for user inputs 640-1, 640-2, and 640-3, a user intent may be determined from the desired changes or improvements, and a user intent database may be updated with the user intent determined from the desired changes or improvements. Based on a user intent history including the current user intent and any previous user intents, it may be determined whether a user intent satisfies a user intent threshold.

If a user intent satisfies a user intent threshold, then a status prompt (e.g., "Great! I can help you with that."), a preview of an image generated according to the desired changes or improvements, and a follow-up prompt (e.g., "Do you want to add any specific elements like skiers or trees?"), may be generated and may be provided to the user via conversational UI 610. In some embodiments, the image generated according to the desired changes or improvements may be displayed to the user via an image editor (e.g., image editor 650). The user may be prompted with further questions, instructions, suggestions, or ideas to solicit from the user further desired changes or improvements to the generated image. This iterative process may be utilized to incrementally refine the description of the desired image until an image may be generated that aligns with the idea, goal, or concept of the user, thereby enhancing the overall design and generation experience. In some embodiments, when a user selects Restart Chat button 612, the chat may be cleared, and a new image generation process may begin. In some embodiments, when a user selects Feedback button 614, the user may be enabled (e.g., via a pop-up window) to provide feedback about the design assistant application.

In some embodiments, a second panel of example view 600 may include image editor 650 for image editing. Image editor 650 may include generated image 652, generated image option 652-1, generated image option 652-2, generated image option 652-3, generated image option 652-4, Download button 654, Save button 656, Edit button 660, Expand button 662, Variations button 664, Like/Dislike buttons 668, and History buttons 670. When a user selects Download button 654, generated image 652 may be downloaded to a device of the user (e.g., client device(s) 110). When a user selects Save button 656, generated image 652 may be saved to a catalog associated with a user account of the user. When a user selects Edit button 660, tools for manipulating generated image 652 (e.g., changing a color or configuration of generated image 652) may appear. When a user selects Expand button 662, a user may be provided with at least one broadened version (e.g., zoomed-out version) of a generated image, wherein the broadened version may maintain the central elements of the generated image. For example, an original generated image may include a person floating in water with one shark swimming around the person. A first broadened version of the original generated image may include the person and the one shark, but may "zoom out" of the original generated image to show a dozen more sharks swimming around the person. A second broadened version of the original generated image may include the person and the shark, but may "zoom out" of the original image to show the person and the shark are in a backyard swimming pool. When a user selects Variations button 664, a user may be provided with alternative versions of generated image 652. For example, an original version of a generated image may include three tacos with a sauce and a lime wedge on the side. Alternative versions of the original image may include a first alternative version with beans included on the side, a second alternative version with only two tacos, and a third alternative version without the sauce on the side. When a user selects Like/Dislike buttons 668, the user may convey a positive opinion or a negative opinion of generated image 652. When a user selects History buttons 670, a user may scroll through and view a history of generated images, which may be displayed in image editor 650.

In some embodiments, image editor 650 may include a Share button. When a user selects the Share button, a generated image may be forwarded (e.g., to another user of the DA application, to a social media platform, to an email account). In some embodiments, image editor 650 may include a Highlight button. When a user selects the Highlight button, the user may be enabled to indicate with a tool cursor (e.g., with a paintbrush tool cursor, a highlighter tool cursor, a free-form selection tool cursor (such as a lasso tool cursor)) an area of a generated image that a user wishes to modify (e.g., add to, replace, or remove). For example, a generated image may include a wedding reception. A user may highlight a centerpiece situated on a table shown in the image. Via a conversational UI (e.g., conversational UI 610), the user may provide a user input that conveys a desire of the user to remove the centerpiece. Based on the highlighting and the user input, the generated image may be updated such that the centerpiece may be removed. In some embodiments, image editor 650 may include a Background Remover button. When a user selects the Background Remover button, the user may be enabled to outline (e.g., with a cursor) an area of a generated image that the user wishes to keep. The area outside of the outlined area may be considered the background of the generated image. Via a conversational UI (e.g., conversational UI 610), the user may provide a user input that conveys a desire of the user to replace the background of the generated image with a different background. Based on the outlining and the user input, the generated image may be updated such that the background of a generated image may be replaced according to the user input.

Figure 7:
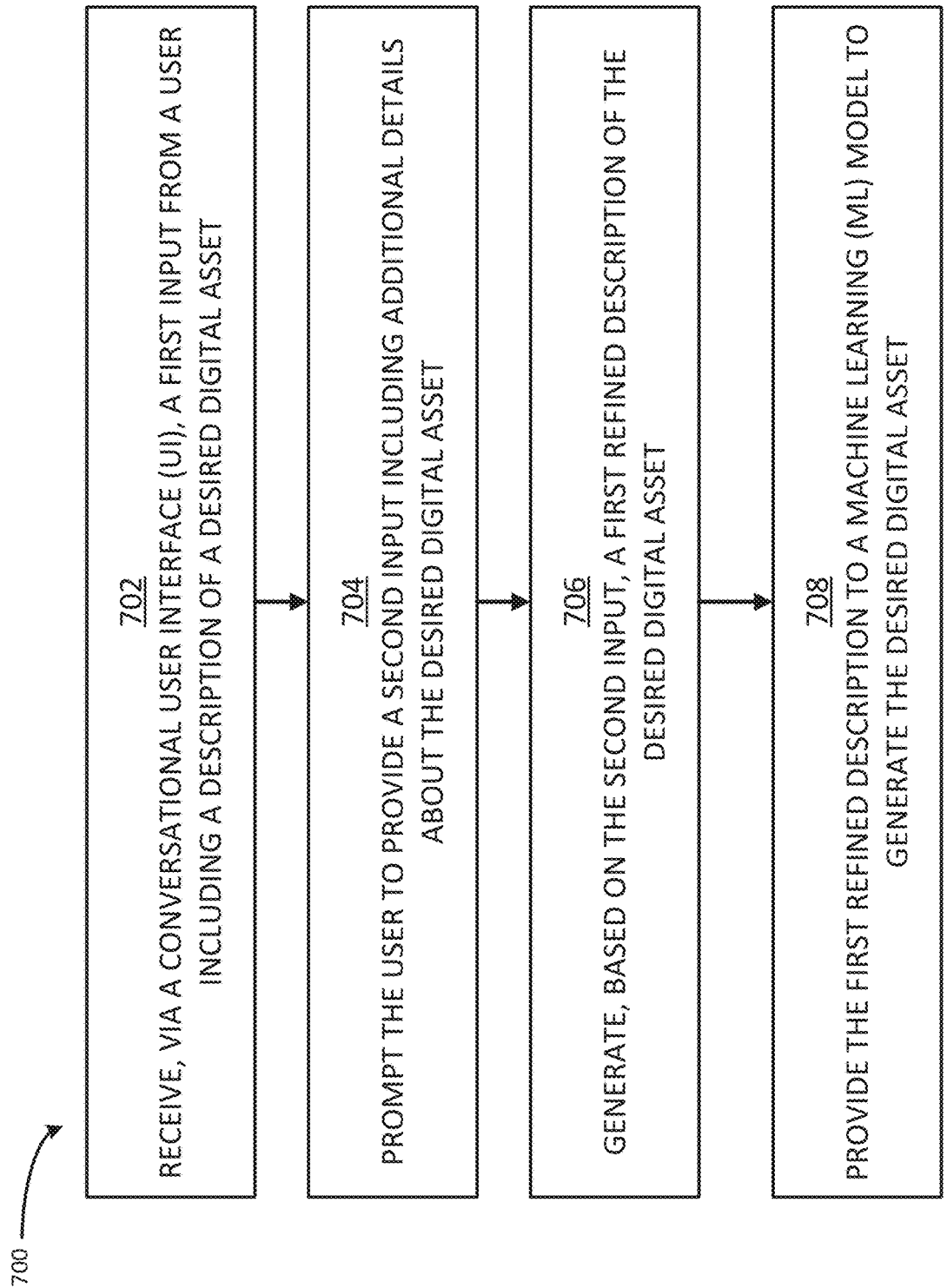
FIG. 7 is a flowchart illustrating operations in a method for generating a digital asset through iterative refinement of descriptions of the digital asset, according to some embodiments.

FIG. 7 is a flowchart illustrating operations in a method 700 for generating a digital asset through iterative refinement of descriptions of the digital asset, according to some embodiments. In some embodiments, methods as disclosed herein may include one or more steps in method 700 performed by a processor circuit executing instructions stored in a memory circuit, in a client device, a remote server or a database, communicatively coupled through a network (e.g., processors 212, memories 220, client device(s) 110, server(s) 130, database 152, and network 150). In some embodiments, one or more of the steps in method 700 may be performed by a user intent module, a prompt generation module, or a digital asset generation module, as disclosed herein (e.g., user intent module 232, prompt generation module 234, or digital asset generation module 236). In some embodiments, processes consistent with the present disclosure may include at least one or more steps as in method 700 performed in a different order, simultaneously, quasi-simultaneously, or overlapping in time.

Operation 702 may include receiving, via a conversational user interface (UI), a first input from a user including a description of a desired digital asset. In some embodiments, operation 702 may include outputting an initiation message, invite message, or greeting to the user. In some embodiments, the first input may include text input. In some embodiments, the desired digital asset may include an image. In some embodiments, operation 702 may include outputting an acknowledgment message when a user input is received. In some embodiments, operation 702 may include determining a user intent associated with the first input. In some embodiments, operation 702 may include determining the user intent fails to satisfy a user intent threshold. In some embodiments, operation 702 may include determining a user intent satisfies a user intent threshold. Based on determining the user intent satisfies the user intent threshold, further aspects of the embodiments may include displaying, via the conversational UI, the desired digital asset, and prompting the user to provide a third input. In further aspects of the embodiments, operation 702 may include generating, based on the third input, a second refined description of the desired digital asset.

Operation 704 may include prompting the user to provide a second input including additional details about a desired digital asset. In some embodiments, the second input may include text input. In some embodiments, prompting the user to provide the second input may include prompting the user based on determining a user intent fails to satisfy a user intent threshold. In some embodiments, prompting the user to provide the second input may include prompting the user with at least one of a question, a suggestion, and an idea formulated by a large language model (LLM). In further aspects of the embodiments, at least one of the question, the suggestion, and the idea may be directed to at least one of a style, a variation, and a content of the desired digital asset. In some aspects of operation 704, the LLM model may be configured to learn and understand text inputs and generate clarifying prompts (e.g., questions) to provide to the user, and provide refined images based on the text responses.

Operation 706 may include generating, based on the second input, a first refined description of a desired digital asset. In some embodiments, a first refined description of a desired digital asset may be formulated by an LLM.

Operation 708 may include providing a first refined description to a machine learning (ML) model to generate a desired digital asset. In some embodiments, the ML model may include a text-to-image model. In some embodiments, operation 708 may include receiving, from the ML model, a generated digital asset. In further aspects of the embodiments, operation 708 may include displaying the generated digital asset via the conversational UI. In some embodiments, operation 708 may include receiving, from the ML model, a plurality of versions of the desired digital asset. In further aspects of the embodiments, operation 708 may include displaying, via the conversational UI, the plurality of versions of the desired digital asset. In further aspects of the embodiments, operation 708 may include receiving, from the user, a selection of at least one of the plurality of versions of the desired digital asset. In some embodiments, a user may be enabled to edit a generated digital asset. In some embodiments, operation 708 may include iteratively prompting the user, receiving input from the user, and refining the description of the desired digital asset until the user indicates that a digital asset generated based on a refined description of the digital asset is complete or finalized. In some embodiments, operation 708 may include outputting a confirmation message after image generation is complete.

Hardware Overview

Figure 8:
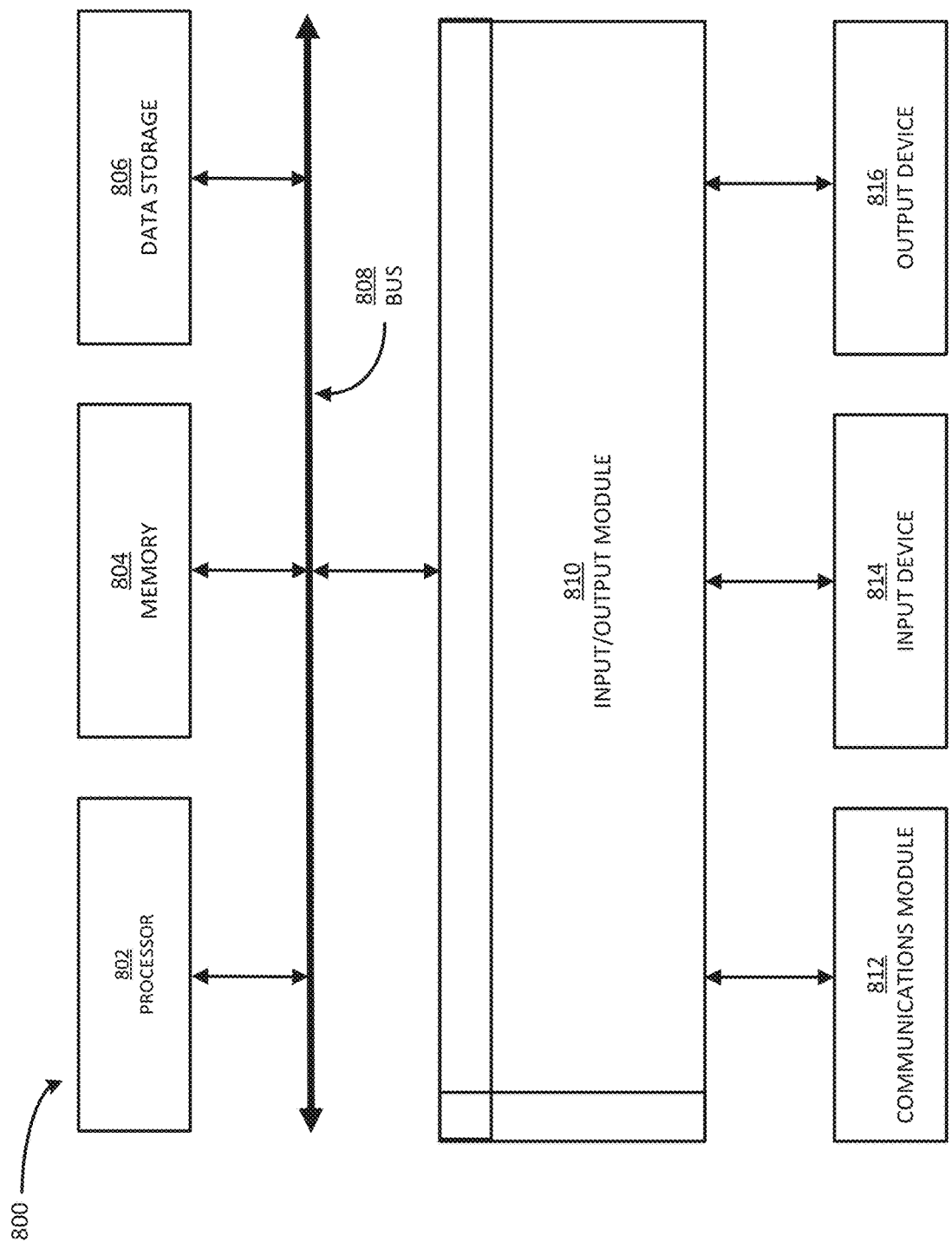
FIG. 8 is a block diagram illustrating an exemplary computer system with which client devices, and the method in FIG. 7, may be implemented, according to some embodiments.

FIG. 8 is a block diagram illustrating an exemplary computer system 800 with which client devices, and the method in FIG. 7, may be implemented, according to some embodiments.

In certain aspects, the computer system 800 may be implemented using hardware or a combination of software and hardware, either in a dedicated server, or integrated into another entity, or distributed across multiple entities.

Computer system 800 (e.g., client device(s) 110 and server(s) 130) may include bus 808 or another communication mechanism for communicating information, and a processor 802 (e.g., processors 212) coupled with bus 808 for processing information. By way of example, computer system 800 may be implemented with one or more processors 802. Processor 802 may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that may perform calculations or other manipulations of information.

Computer system 800 may include, in addition to hardware, code that creates an execution environment for the computer program in question, e.g., code that constitutes processor firmware, a protocol stack, a database management system, an operating system, or a combination of one or more of them stored in an included memory 804 (e.g., memories 220), such as a Random Access Memory (RAM), a flash memory, a Read-Only Memory (ROM), a Programmable Read-Only Memory (PROM), an Erasable PROM (EPROM), registers, a hard disk, a removable disk, a CD-ROM, a DVD, or any other suitable storage device, coupled to bus 808 for storing information and instructions to be executed by processor 802. Processor 802 and the memory 804 may be supplemented by, or incorporated in, special purpose logic circuitry.

The instructions may be stored in memory 804 and implemented in one or more computer program products, e.g., one or more modules of computer program instructions encoded on a computer-readable medium for execution by, or to control the operation of, computer system 800, and according to any method well-known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, wirth languages, and xml-based languages. Memory 804 may also be used for storing temporary variable or other intermediate information during execution of instructions to be executed by processor 802.

A computer program as discussed herein does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program may be deployed to be executed on one computer or on multiple computers that may be located at one site or distributed across multiple sites and interconnected by a communication network. The processes and logic flows described in this specification may be performed by one or more programmable processors executing one or more computer programs to perform functions by operating on input data and generating output.

Computer system 800 further includes a data storage device 806 such as a magnetic disk or optical disk, coupled to bus 808 for storing information and instructions. Computer system 800 may be coupled via input/output module 810 to various devices. Input/output module 810 may be any input/output module. Exemplary input/output modules 810 include data ports such as Universal Serial Bus (USB) ports. The input/output module 810 may be configured to connect to a communications module 812. Exemplary communications modules 812 (e.g., communications modules 218) include networking interface cards, such as Ethernet cards and modems. In certain aspects, input/output module 810 may be configured to connect to a plurality of devices, such as an input device 814 (e.g., input device 214) and/or an output device 816 (e.g., output device 216). Exemplary input devices 814 include a keyboard and a pointing device, e.g., a mouse or a trackball, by which a user may provide input to computer system 800. Other kinds of input devices 814 may be used to provide for interaction with a user as well, such as a tactile input device, visual input device, audio input device, or brain-computer interface device. For example, feedback provided to the user may be any form of sensory feedback, e.g., visual feedback, auditory feedback, or tactile feedback; and input from the user may be received in any form, including acoustic, speech, tactile, or brain wave input. Exemplary output devices 816 include display devices, such as an LCD (liquid crystal display) monitor, for displaying information to the user.

According to one aspect of the present disclosure, client device(s) 110 and server(s) 130 may be implemented using computer system 800 in response to processor 802 executing one or more sequences of one or more instructions contained in memory 804. Such instructions may be read into memory 804 from another machine-readable medium, such as data storage device 806. Execution of the sequences of instructions contained in memory 804 causes processor 802 to perform the process steps described herein. One or more processors in a multi-processing arrangement may also be employed to execute the sequences of instructions contained in memory 804. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification may be implemented in a computing system that includes a back-end component, e.g., a data server, or that includes a middleware component, e.g., an application server, or that includes a front-end component, e.g., a client computer having a graphical user interface or a Web browser through which a user may interact with an implementation of the subject matter described in this specification, or any combination of one or more such back-end, middleware, or front-end components. The components of the system may be interconnected by any form or medium of digital data communication, e.g., a communication network. The communication network (e.g., network 150) may include, for example, any one or more of a LAN, a WAN, the Internet, and the like. Further, the communication network may include, but is not limited to, for example, any one or more of the following tool topologies, including a bus network, a star network, a ring network, a mesh network, a star-bus network, tree or hierarchical network, or the like. The communications modules may be, for example, modems or Ethernet cards.

Computer system 800 may include clients and servers. A client and server may be generally remote from each other and typically interact through a communication network. The relationship of client and server arises by virtue of computer programs running on the respective computers and having a client-server relationship to each other. Computer system 800 may be, for example, and without limitation, a desktop computer, laptop computer, or tablet computer. Computer system 800 may also be embedded in another device, for example, and without limitation, a mobile telephone, a PDA, a mobile audio player, a Global Positioning System (GPS) receiver, a video game console, and/or a television set top box.

The term "machine-readable storage medium" or "computer-readable medium" as used herein refers to any medium or media that participates in providing instructions to processor 802 for execution. Such a medium may take many forms, including, but not limited to, non-volatile media, volatile media, and transmission media. Non-volatile media include, for example, optical or magnetic disks, such as data storage device 806. Volatile media include dynamic memory, such as memory 804. Transmission media include coaxial cables, copper wire, and fiber optics, including the wires forming bus 808. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer may read. The machine-readable storage medium may be a machine-readable storage device, a machine-readable storage substrate, a memory device, a composition of matter affecting a machine-readable propagated signal, or a combination of one or more of them.

To illustrate the interchangeability of hardware and software, items such as the various illustrative blocks, modules, components, methods, operations, instructions, and algorithms have been described generally in terms of their functionality. Whether such functionality is implemented as hardware, software, or a combination of hardware and software depends upon the particular application and design constraints imposed on the overall system. Skilled artisans may implement the described functionality in varying ways for each particular application.

General Notes on Terminology

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

To the extent that the term "include," "have," or the like is used in the description or the claims, such term is intended to be inclusive in a manner similar to the term "comprise" as "comprise" is interpreted when employed as a transitional word in a claim. The word "exemplary" is used herein to mean "serving as an example, instance, or illustration." Any embodiment described herein as "exemplary" is not necessarily to be construed as preferred or advantageous over other embodiments.

A reference to an element in the singular is not intended to mean "one and only one" unless specifically stated, but rather "one or more." All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No clause element is to be construed under the provisions of 35 U.S.C. § 112, sixth paragraph, unless the element is expressly recited using the phrase "means for" or, in the case of a method clause, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

The subject matter of this specification has been described in terms of particular aspects, but other aspects may be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims may be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems may generally be integrated together in a single software product or packaged into multiple software products. Other variations are within the scope of the following claims.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a configuration may refer to one or more configurations and vice versa.

In one aspect, unless otherwise stated, all measurements, values, ratings, positions, magnitudes, sizes, and other specifications that are set forth in this specification, including in the clauses that follow, are approximate, not exact. In one aspect, they are intended to have a reasonable range that is consistent with the functions to which they relate and with what is customary in the art to which they pertain. It is understood that some or all steps, operations, or processes may be performed automatically, without the intervention of a user. Method clauses may be provided to present elements of the various steps, operations, or processes in a sample order, and are not meant to be limited to the specific order or hierarchy presented.

Although illustrative embodiments have been shown and described, a wide range of modification, change, and substitution are contemplated in the foregoing disclosure and in some instances, some features of the embodiments may be employed without a corresponding use of other features. Those of ordinary skill in the art would recognize many variations, alternatives, and modifications. Thus, the scope of the invention should be limited only by the following claims, and it is appropriate that the claims be construed broadly and in a manner consistent with the scope of the embodiments disclosed herein.

What is claimed is:

1. A computer-implemented method, comprising:
   receiving, via a conversational user interface (UI), a first input from a user including a description of a desired digital asset;
   prompting the user to provide a second input including additional details about the desired digital asset;
   generating, based on the second input, a first refined description of the desired digital asset;
   providing the first refined description to a machine learning (ML) model to generate the desired digital asset; and
   enabling, via an editor interface associated with the conversational UI, the user to modify the generated desired digital asset.

2. The computer-implemented method of claim 1, wherein:
   each of the first input and the second input includes text input;
   the desired digital asset includes an image; and
   the ML model includes a text-to-image model.

3. The computer-implemented method of claim 1, further comprising:
   determining a user intent associated with the first input; and
   determining the user intent fails to satisfy a user intent threshold.

4. The computer-implemented method of claim 3, wherein prompting the user to provide the second input includes prompting the user based on determining the user intent fails to satisfy the user intent threshold.

5. The computer-implemented method of claim 1, further comprising:
   determining a user intent associated with the first input; and
   determining the user intent satisfies a user intent threshold.

6. The computer-implemented method of claim 5, further comprising:
   based on determining the user intent satisfies the user intent threshold:
     displaying, via the conversational UI, the desired digital asset; and
     prompting the user to provide a third input; and
   generating, based on the third input, a second refined description of the desired digital asset.

7. The computer-implemented method of claim 1, wherein prompting the user to provide the second input includes prompting the user with at least one of a question, a suggestion, and an idea formulated by a large language model (LLM).

8. The computer-implemented method of claim 7, wherein at least one of the question, the suggestion, and the idea are directed to at least one of a style, a variation, and a content of the desired digital asset.

9. The computer-implemented method of claim 1, further comprising:
   receiving, from the ML model, a plurality of versions of the desired digital asset;
   displaying, via the conversational UI, the plurality of versions of the desired digital asset; and
   receiving, from the user, a selection of at least one of the plurality of versions of the desired digital asset.

10. A system, comprising:
    one or more processors; and
    a memory storing instructions that, when executed by the one or more processors, cause the system to perform operations including:
      receiving, via a conversational user interface (UI), a first input from a user including a description of a desired digital asset;
      prompting the user to provide a second input including additional details about the desired digital asset;
      generating, based on the second input, a first refined description of the desired digital asset;

providing the first refined description to a machine learning (ML) model to generate the desired digital asset; and enabling, via an editor interface associated with the conversational UI, the user to modify the generated desired digital asset.

11. The system of claim 10, wherein:

each of the first input and the second input includes text input;

the desired digital asset includes an image; and the ML model includes a text-to-image model.

12. The system of claim 10, wherein the operations further include:

determining a user intent associated with the first input; and determining the user intent fails to satisfy a user intent threshold.

13. The system of claim 12, wherein prompting the user to provide the second input includes prompting the user based on determining the user intent fails to satisfy the user intent threshold.

14. The system of claim 10, wherein the operations further include:

determining a user intent associated with the first input; and determining the user intent satisfies a user intent threshold.

15. The system of claim 14, wherein the operations further include:

based on determining the user intent satisfies the user intent threshold:

displaying, via the conversational UI, the desired digital asset; and prompting the user to provide a third input; and generating, based on the third input, a second refined description of the desired digital asset.

16. The system of claim 10, wherein:

prompting the user to provide the second input includes prompting the user with at least one of a question, a suggestion, and an idea formulated by a large language model (LLM); and at least one of the question, the suggestion, and the idea are directed to at least one of a style, a variation, and a content of the desired digital asset.

17. The system of claim 10, wherein the operations further include:

receiving, from the ML model, a plurality of versions of the desired digital asset;

displaying, via the conversational UI, the plurality of versions of the desired digital asset; and receiving, from the user, a selection of at least one of the plurality of versions of the desired digital asset.

18. A non-transitory computer-readable storage medium storing instructions encoded thereon that, when executed by a processor, cause the processor to perform operations comprising:

receiving, via a conversational user interface (UI), a first input from a user including a description of a desired digital asset;

determining a user intent associated with the first input;

determining the user intent fails to satisfy a user intent threshold;

based on determining the user intent fails to satisfy the user intent threshold, prompting the user, with at least one of a question, a suggestion, and an idea formulated by a large language model (LLM), to provide a second input including additional details about the desired digital asset;

generating, based on the second input, a first refined description of the desired digital asset;

providing the first refined description to a machine learning (ML) model to generate the desired digital asset; and enabling, via an editor interface associated with the conversational UI, the user to modify the generated desired digital asset.

* * * * *